United States Patent
Lee et al.

(10) Patent No.: US 11,626,282 B2
(45) Date of Patent: Apr. 11, 2023

(54) GRAPHENE STRUCTURE AND METHOD OF FORMING GRAPHENE STRUCTURE

(71) Applicant: Samsung Electronics Co., Ltd., Suwon-si (KR)

(72) Inventors: Eunkyu Lee, Yongin-si (KR); Kyung-Eun Byun, Seongnam-si (KR); Hyunjae Song, Hwaseong-si (KR); Hyeonjin Shin, Suwon-si (KR); Changhyun Kim, Seoul (KR); Keunwook Shin, Yongin-si (KR); Changseok Lee, Seoul (KR); Alum Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 225 days.

(21) Appl. No.: 16/678,115

(22) Filed: Nov. 8, 2019

(65) Prior Publication Data
US 2020/0350164 A1 Nov. 5, 2020

(30) Foreign Application Priority Data
Apr. 30, 2019 (KR) .......................... 10-2019-0050720

(51) Int. Cl.
*H01L 21/02* (2006.01)
*H01L 29/16* (2006.01)
*H01L 29/165* (2006.01)

(52) U.S. Cl.
CPC .... *H01L 21/02447* (2013.01); *H01L 21/0262* (2013.01); *H01L 21/02381* (2013.01);
(Continued)

(58) Field of Classification Search
CPC ......... H01L 21/02447; H01L 21/02381; H01L 21/02499; H01L 21/02527; H01L 21/0262;
(Continued)

(56) References Cited

U.S. PATENT DOCUMENTS 7,988,941 B2   8/2011   Choi et al.
8,476,765 B2   7/2013   Zhang et al.
(Continued)

FOREIGN PATENT DOCUMENTS

CN   103121670 A   5/2013
CN   103572247 A   2/2014
(Continued)

OTHER PUBLICATIONS

Malesevic et al., Synthesis of few-layer graphene via microwave plasma-enhanced chemical vapour deposition, 2008, Nanotechnology, 19 (Year: 2008).*
(Continued)

*Primary Examiner* — Kenneth Parker
*Assistant Examiner* — Christopher A Culbert
(74) *Attorney, Agent, or Firm* — Harness, Dickey & Pierce, P.L.C.

(57) ABSTRACT

Provided are a graphene structure and a method of forming the graphene structure. The graphene structure includes a substrate and graphene on a surface of the substrate. Here, a bonding region in which a material of the substrate and carbon of the graphene are covalently bonded is formed between the surface of the substrate and the graphene.

18 Claims, 12 Drawing Sheets

(52) U.S. Cl.
CPC .. *H01L 21/02499* (2013.01); *H01L 21/02527* (2013.01); *H01L 21/02658* (2013.01); *H01L 29/165* (2013.01); *H01L 29/1606* (2013.01); *H01L 29/1608* (2013.01)

(58) Field of Classification Search
CPC .......... H01L 21/02658; H01L 29/1606; H01L 29/1608; H01L 29/165
See application file for complete search history.

(56) References Cited

U.S. PATENT DOCUMENTS

| | | |
|---|---|---|
| 8,808,810 B2 | 8/2014 | Veerasamy |
| 9,306,005 B2 | 4/2016 | Byun et al. |
| 9,371,234 B2 | 6/2016 | Hong et al. |
| 9,472,450 B2 | 10/2016 | Bonilla et al. |
| 9,499,408 B2 | 11/2016 | Rieken |
| 9,543,156 B1 | 1/2017 | Hu |
| 10,738,377 B2 | 8/2020 | Matsumoto |
| 2004/0253167 A1 | 12/2004 | Silva et al. |
| 2007/0082488 A1 | 4/2007 | Katou |
| 2011/0117328 A1 | 5/2011 | Ivanov |
| 2011/0143045 A1 | 6/2011 | Veerasamy |
| 2012/0021249 A1 | 1/2012 | Shin et al. |
| 2012/0034762 A1* | 2/2012 | Bryce ............... H01L 21/76814 438/478 |
| 2012/0138903 A1 | 6/2012 | Chung et al. |
| 2012/0139114 A1 | 6/2012 | Zhang et al. |
| 2012/0141799 A1 | 6/2012 | Kub et al. |
| 2012/0147147 A1 | 6/2012 | Park et al. |
| 2012/0261644 A1 | 10/2012 | Dimitrakopoulos |
| 2013/0001515 A1 | 1/2013 | Li et al. |
| 2013/0130011 A1 | 5/2013 | Hong et al. |
| 2013/0187097 A1 | 7/2013 | Hong et al. |
| 2013/0192461 A1 | 8/2013 | Miller et al. |
| 2013/0299988 A1 | 11/2013 | Bonilla et al. |
| 2013/0321584 A1 | 12/2013 | Choi |
| 2014/0145332 A1 | 5/2014 | Ryan et al. |
| 2014/0272195 A1 | 9/2014 | McAlister |
| 2014/0287155 A1* | 9/2014 | Matsumoto ............... B01J 23/72 427/535 |
| 2014/0353722 A1 | 12/2014 | Zhang et al. |
| 2015/0013593 A1 | 1/2015 | Dong |
| 2015/0091175 A1 | 4/2015 | Chandhok et al. |
| 2015/0235847 A1 | 8/2015 | Beasley et al. |
| 2015/0235959 A1 | 8/2015 | Lee et al. |
| 2016/0064489 A1 | 3/2016 | Zhang et al. |
| 2016/0068397 A1 | 3/2016 | Su et al. |
| 2016/0075560 A1 | 3/2016 | Kagaya et al. |
| 2016/0270237 A1 | 9/2016 | Cho et al. |
| 2016/0339160 A1 | 11/2016 | Bedworth et al. |
| 2016/0365585 A1 | 12/2016 | Kamepalli et al. |
| 2017/0033003 A1 | 2/2017 | Song et al. |
| 2017/0125320 A1 | 5/2017 | Sung et al. |
| 2017/0152146 A1 | 6/2017 | Kim et al. |
| 2017/0154701 A1 | 6/2017 | Lee et al. |
| 2017/0221996 A1 | 8/2017 | Park et al. |
| 2018/0057933 A1 | 3/2018 | Ifuku et al. |
| 2018/0149966 A1 | 5/2018 | Shin et al. |
| 2018/0187298 A1 | 7/2018 | Matsumoto |
| 2019/0096801 A1 | 3/2019 | Yang et al. |
| 2019/0108948 A1 | 4/2019 | Chai et al. |
| 2019/0144283 A1 | 5/2019 | Jakobsen et al. |
| 2019/0161351 A1 | 5/2019 | Song et al. |
| 2019/0285548 A1 | 9/2019 | Nunney et al. |
| 2019/0345610 A1 | 11/2019 | Song et al. |
| 2020/0039827 A1 | 2/2020 | Jung et al. |
| 2020/0071233 A1 | 3/2020 | Joo et al. |
| 2020/0105524 A1 | 4/2020 | Shin et al. |
| 2020/0140279 A1 | 5/2020 | Shin et al. |
| 2020/0286732 A1 | 9/2020 | Shin et al. |
| 2020/0350164 A1 | 11/2020 | Lee et al. |
| 2020/0354829 A1 | 11/2020 | Song et al. |

FOREIGN PATENT DOCUMENTS

| | | |
|---|---|---|
| CN | 10312670 B | 4/2015 |
| CN | 105585011 A | 5/2016 |
| JP | 2013249530 A | 12/2013 |
| JP | 2014170826 A | 9/2014 |
| KR | 20120012271 A | 2/2012 |
| KR | 20120059853 A | 6/2012 |
| KR | 101312454 B1 | 9/2013 |
| KR | 101313746 B1 | 10/2013 |
| KR | 2014-0005470 A | 1/2014 |
| KR | 101381008 B1 | 4/2014 |
| KR | 2014-0090333 A | 7/2014 |
| KR | 101493893 B1 | 2/2015 |
| KR | 20150012251 A | 2/2015 |
| KR | 2015-0082197 A | 7/2015 |
| KR | 20150098180 A | 8/2015 |
| KR | 2015-0116570 A | 10/2015 |
| KR | 20150121680 A | 10/2015 |
| KR | 2016-0059468 A | 5/2016 |
| KR | 20160085418 A | 7/2016 |
| KR | 20160112245 A | 9/2016 |
| KR | 20180025819 A | 3/2018 |
| WO | WO-2015022500 A1 | 2/2015 |
| WO | WO-2015149116 A1 | 10/2015 |

OTHER PUBLICATIONS

Chen et al., Two-Stage Metal-Catalyst-Free Growth of High-Quality Polycrystalline Graphene Films on Silicon Nitride Substrates, 2013, Advanaced Materials 25, 992-997 (Year: 2013).*
Office Action dated Nov. 3, 2020, received in corresponding U.S. Appl. No. 16/884,590.
Extended European Search report dated Dec. 20, 2019, issued in corresponding European Patent Application No. 19171535.6.
Office Action dated Dec. 22, 2020, received in corresponding U.S. Appl. No. 16/183,146.
Office Action dated Dec. 24, 2020, received in corresponding U.S. Appl. No. 16/260,403.
Office Action dated Apr. 9, 2020, received in corresponding U.S. Appl. No. 16/215,899.
Guizhen Wang et al., 'High densities of magnetic nanoparticles supported on graphene fabricated by atomic layer deposition and their use as efficient synergistic microwave absorbers' *Nano Research*, 7(5), Feb. 2014, pp. 704-716, DOI 10.1007/s12274-014-0432-0.
Yijun Zhang et al. 'Low-Temperature Remote Plasma-Enhanced Atomic Layer Deposition of Graphene and Characterization of its Atomic-Level Structure' *Journal of Materials Chemistry C*, 2, 2014, pp. 7570-7574.
Notice of Allowance dated Jun. 23, 2021, received in corresponding U.S. Appl. No. 16/244,906.
Notice of Allowance dated Jul. 21, 2021, received in corresponding U.S. Appl. No. 16/183,146.
Office Action dated Jun. 11, 2020, received in corresponding U.S. Appl. No. 16/183,146.
Notice of Preliminary Examination Result dated Mar. 20, 2018, issued in corresponding Korean Patent Application No. KR 10-2017-0161833.
Menglin Li et al., 'Controllable Synthesis of Graphene by Plasma-Enhanced Chemical Vapor Deposition and Its Related Applications' *Advanced Science* 2016, 3, 1600003.
Office Action dated Sep. 21, 2020, received in corresponding U.S. Appl. No. 16/215,899.
Notice of Allowance dated Dec. 9, 2020, received in corresponding U.S. Appl. No. 16/215,899.
"Allotropes of Carbon", Introduction to Chemistry: nonmetallic elements; 10 pages; retrieved from the Internet Jan. 14, 2021 from ://courses.lumenlearning.com/introchem/chapter/allotropes-of-carbon/#:~:text = there are several allotropes of walled carbon nanotubes%2C or b . . .
"6.3 Forms of Crystalline Carbon"; flex books 2.0, CK-12 Physical Science for Middle School; 7 pages; last modified Jul. 3, 2019, retrieved from the Internet Jan. 14, 2021 from ://flexbooks.CK12.

(56) References Cited

OTHER PUBLICATIONS org/cbook/CK-12-middle-school-physical-science-flex-book-2.0/section/6.3/primary/lesson/crystalline-carbon-ms-ps.
Office Action dated Feb. 1, 2021, received in corresponding U.S. Appl. No. 16/244,906.
Machine translation CN 103572247 A (published Feb. 12, 2014) via ESpaceNet.
Yong Seung Kim, Direct Integration of Polycrystalline Graphene into Light Emitting Diodes by Plasma-Asissted Metal-Catalyst-Free Synthesis, ACS nano, vol. 8, No. 3; 2230-2236, 2014.
Office Action from the Korean Patent Office dated Jun. 11, 2018 for KR Appl. No. 10-2017-0161833.
European Search Report dated Mar. 29, 2019, issued in corresponding European Patent Application No. 18206535.9.
Wang et al., "Synthesis of graphene on a polycrystalline Co film by radio-frequency plasma-enhanced chemical vapour deposition", J.Phys, D:Appl.Phys. 43 (2010) 455402.
Liu et al., "Two-step growth of graphene with separate controlling nucleation and edge growth directly on $SiO_2$ substrates" Carbon 72 (2014) pp. 387-392.
Kim et al., "Direct growth of patterned graphene on $SiO_2$ substrates without the use of catelysts or lithography" Nanoscale (2014). 6. pp. 10100-10105.
"Graphene", Scientific Background on the Nobel Prize in Physics 2010, compiled by the Class for Physics of the Royal Swedish Academy of Sciences.
Extended Search Report dated Jul. 31, 2019 issued in corresponding European Patent Application No. 18212973.4.
Extended European Search report dated Aug. 7, 2019, issued in corresponding European Patent Application No. 18206535.9.
Y. Wang et al., 'Toward High Throughput Interconvertible Graphane-to-Graphene Growth and Patterning', *ACS Nano*, vol. 4, No. 10, 2010, pp. 6146-6152.
Z. Luo et al., 'Thickness-Dependent Reversible Hydrogenation of Graphene Layers', *ACS Nano*, vol. 3, No. 7, 2009, pp. 1781-1788.
L. Pedrazzetti et al., 'Growth and characterization of ultrathin carbon films on electrodeposited Cu and Ni', *Surface and Interface Analysis*, vol. 49, 2017, pp. 1088-1094.
Notice of Allowance dated Apr. 9, 2021, received in corresponding U.S. Appl. No. 16/260,403.
Office Action dated Apr. 14, 2021, received in corresponding U.S. Appl. No. 16/884,590.
Richard J. Lewis, Sr., editor; Hawley's Condensed Chemical Dictionary; 12th edition; Van Nostrand Reinhold Company, New York; 1993; pp. 3, 25, 254, and 994-995.
Office Action dated Jul. 17, 2020, received in corresponding U.S. Appl. No. 16/244,906.
Office Action dated Jul. 10, 2020, received in corresponding U.S. Appl. No. 16/884,590.

\* cited by examiner

Pre-treatment Gas (H₂)

Gas (H₂) Plasma

Reaction Gas ( $C_2H_2$ , Ar , $H_2$ )

Gas ( $C_2H_2$ , Ar , $H_2$ ) Plasma

Gas ( $C_2H_2$ , Ar , $H_2$ ) Plasma

Pre-treatment Gas (H$_2$)

Gas (H$_2$) Plasma

Reaction Gas ( $C_2H_2$ , Ar , $H_2$ )

Gas ( $C_2H_2$ , Ar , $H_2$ ) Plasma 1

Gas ( $C_2H_2$ , Ar , $H_2$ ) Plasma 1

Gas ( $C_2H_2$ , Ar , $H_2$ ) Plasma 2

Ion Bombardment Process

GRAPHENE STRUCTURE AND METHOD OF FORMING GRAPHENE STRUCTURE

CROSS-REFERENCE TO RELATED APPLICATION

This application claims the benefit of Korean Patent Application No. 10-2019-0050720, filed on Apr. 30, 2019, in the Korean Intellectual Property Office, the disclosure of which is incorporated herein in its entirety by reference.

BACKGROUND

1. Field

The present disclosure relates to graphene structures and methods of forming the graphene structures, and more particularly to a graphene structure having improved adhesion between graphene and a substrate and a method of forming the graphene structure.

2. Description of Related Art

In the fields of semiconductor devices, studies on graphene have been actively conducted in order to solve the problem of resistance increase due to reduction in the width of metal wiring and the necessity of development of new metal barrier material. Graphene is a material having a hexagonal honeycomb structure in which carbon atoms are two-dimensionally connected and has a very small thickness at the atomic size level. Such graphene has advantages of high electric mobility and excellent thermal characteristics compared to silicon (Si), and has chemical stability and wide surface area.

In order to apply graphene to a semiconductor device, it is advantageous to directly grow graphene on a semiconductor substrate. However, when graphene is directly grown, adhesion between the semiconductor substrate and the graphene may be weakened.

SUMMARY

Provided are graphene structures having improved adhesion between graphene and a substrate, and methods of forming the graphene structures.

According to an aspect of an embodiment, a graphene structure includes a substrate; graphene on a surface of the substrate; and a bonding region, where a material of the substrate and carbon of the graphene are covalently bonded, between the surface of the substrate and the graphene.

In some embodiments, the bonding region may be formed to cover a part or all of the surface of the substrate.

In some embodiments, the substrate may include silicon (Si) and the bonding region may include a silicon-carbon (Si—C) bond. The graphene may have a thickness of 1 nm to 2 nm.

In some embodiments, the surface of the substrate may have nano-sized roughness.

According to an aspect of another embodiment, a method of forming a graphene structure is provided. The method includes: forming a bonding site inducing a covalent bond with carbon on a surface of a substrate, the forming the bonding site including treating the surface of the substrate using a plasma having power equal to or greater than 600 W; and directly growing a graphene on the surface of the substrate via a plasma enhanced chemical vapor deposition (PECVD) process. The directly growing the graphene may include forming a bonding region, in which a material of the substrate and carbon of the graphene are covalently bonded, between the surface of the substrate and the graphene.

In some embodiments, the directly growing the graphene may include forming the bonding region to cover a part or all of the surface of the substrate.

In some embodiments, the substrate may include silicon (Si) and the bonding region may include a silicon-carbon (Si—C) bond.

In some embodiments, the directly growing the graphene may include growing the graphene to a thickness of 1 nm to 2 nm.

In some embodiments, the method may further include roughening the surface of the substrate before the surface of the substrate is treated.

In some embodiments, during the forming the bonding site, the treating the surface of the substrate may include: injecting a pre-treatment gas into a process chamber where the substrate is provided; and generating the plasma in the process chamber.

In some embodiments, the treating the surface of the substrate may be performed at a process temperature lower than or equal to 700° C.

In some embodiments, the directly growing the graphene may include injecting a reaction gas into the process chamber, the reaction gas including a carbon a carbon source; and directly growing the graphene on the surface of the substrate by generating an other plasma in the process chamber.

In some embodiments, the directly growing the graphene may be performing using a plasma power of lower than 600 W.

According to an aspect of another embodiment, a method of forming a graphene structure is provided. The method includes: injecting a reaction gas into a process chamber where a substrate is provided, the reaction gas including a carbon source; forming a bonding site inducing a covalent bond with carbon on a surface of the substrate, the forming the bonding site including generating a plasma having power equal to or greater than 600 W, the forming the bonding site being performed in the process chamber; and directly growing graphene on the surface of the substrate via a plasma enhanced chemical vapor deposition (PECVD) process. The directly growing the graphene includes forming a bonding region, in which a material of the substrate and carbon of the graphene are covalently bonded, between the surface of the substrate and the graphene.

In some embodiments, the directly growing the graphene may include forming the bonding region to cover a part or all of the surface of the substrate.

In some embodiments, the substrate may include silicon (Si) and the bonding region may include a silicon-carbon (Si—C) bond.

In some embodiments, the directly growing the graphene may include growing the graphene to have a thickness of 1 nm to 2 nm.

In some embodiments, the method may further include roughening the surface of the substrate before the injecting of the reaction gas.

In some embodiments, the method may further include treating the surface of the substrate using plasma before the injecting of the reaction gas.

According to an aspect of another embodiment, a method of forming a graphene structure is provided. The method includes plasma-treating a surface of a substrate using a power greater than or equal to 600 W, the substrate including a material capable of forming a covalent bond with carbon, the plasma-treating the surface of the substrate providing a plasma-treated surface of the substrate; and directly growing a graphene on the plasma-treated surface of the substrate, a portion of the graphene being covalently bonded to the material of the substrate.

In some embodiments, the plasma-treating the surface of the substrate may include injecting a pre-treatment gas into a process chamber while the substrate is in the process chamber, and the directly growing the graphene may include injecting a reaction gas into the process chamber and performing a plasma enhanced chemical vapor deposition (PECVD) on the substrate while the reaction gas and the substrate are in the process chamber. The reaction gas may include a carbon source.

In some embodiments, the plasma-treating the surface of the substrate may include injecting a first reaction gas into a process chamber while the substrate is in the process chamber, and the directly growing the graphene may include injecting a second reaction gas into the process chamber and performing a plasma enhanced chemical vapor deposition (PECVD) process on the substrate while the second reaction gas and the substrate are in the process chamber. The first reaction gas may include a first carbon source. The second reaction gas may include a second carbon source.

In some embodiments, the directly growing the graphene includes growing the graphene to a thickness of 1 nm to 2 nm.

In some embodiments, the substrate may include silicon (Si), and the portion of the graphene that is covalently bonded to the material of the substrate may have a SiC content in a range of 40% to 60%.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
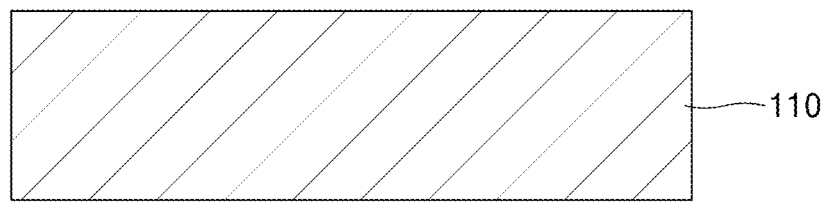
FIGS. 1 through 6 are views for describing a method of forming a graphene structure, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The use of the term "the" and similar indicative terms may refer to both the singular and the plural. Unless an order of operations constituting a method is explicitly stated or a contrary order is stated, the operations may be performed in an appropriate order. The operations are not necessarily limited by a described order. The use of all examples and example terms is merely intended to describe technical concept and the scope is not limited by the examples and example terms unless defined in claims.

Graphene is a material in which carbon atoms are two-dimensionally connected to have a hexagonal honeycomb structure, and has a very small thickness of an atomic size level. Such graphene has advantages of high electric mobility and excellent thermal characteristics compared to silicon (Si), and has chemical stability and wide surface area. In embodiments below, a method of forming graphene directly on a substrate without a catalyst will be described.

FIGS. 1 through 6 are views for describing a method of forming a graphene structure, according to an embodiment.

Figure 2:
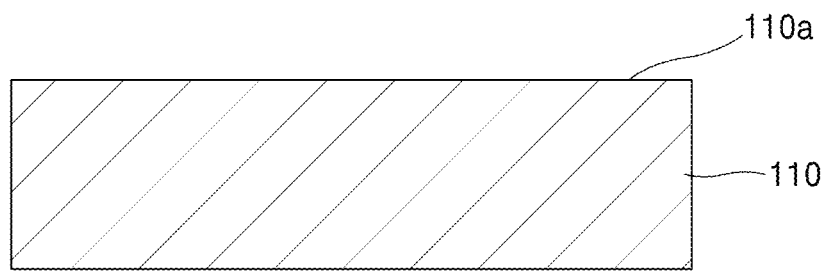
Figure 5:
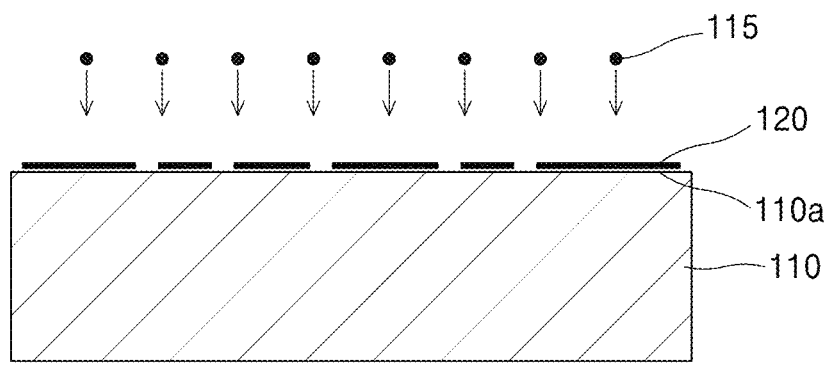
Figure 6:
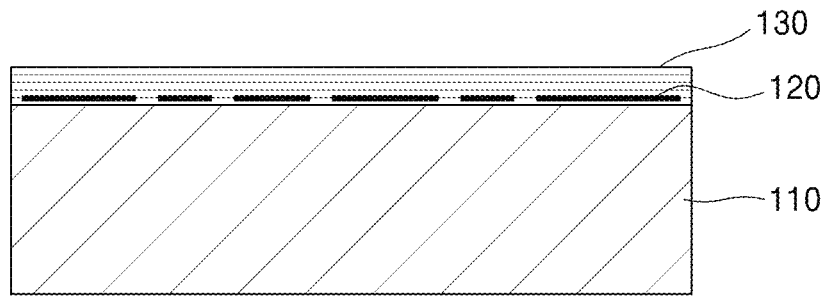

The method according to the current embodiment includes a pre-treatment process of a substrate 110 of FIG. 1, in which a surface of the substrate 110 is treated, and a growth process of graphene, in which a graphene layer 130 of FIG. 6 is grown on the surface of the substrate 110. In FIGS. 1 and 2, the pre-treatment process of the substrate 110 is illustrated and in FIGS. 3 through 6, the growth process of the graphene is illustrated.

Hereinafter, the pre-treatment process of the substrate 110 will be described first with reference to FIGS. 1 and 2.

Referring to FIG. 1, a certain pre-treatment gas is injected into a process chamber (not shown), where the substrate 110 is provided.

As will be described below, the substrate 110 may include a material capable of forming a covalent bond with carbon. The substrate 110 may include, for example, a semiconductor material. Here, the semiconductor material may include, for example, a Group IV semiconductor material or a semiconductor compound. In particular, the substrate 110 may include silicon (Si). However, this is only an example, and the substrate 110 may include other various semiconductor materials. The substrate 110 may further include a dopant. Meanwhile, the substrate 110 may include a metal material.

The pre-treatment gas injected into the process chamber during the pre-treatment process of the substrate 110 may include, for example, at least one of an inert gas, hydrogen, oxygen, ammonia, chlorine, bromine, fluorine, and fluorocarbon, or a combination thereof. However, the pre-treatment gas is not limited thereto. The insert gas may include, for example, at least one of an argon gas, a neon gas, a nitrogen gas, a helium gas, a krypton gas, and a xenon gas, or a combination thereof. FIG. 1 illustrates an example in which a hydrogen gas is used as the pre-treatment gas.

Referring to FIG. 2, power for generating plasma inside the process chamber is applied from a plasma source (not shown) while the pre-treatment gas is injected into the process chamber. Plasma power applied during the pre-treatment process of the substrate 110 may be relatively greater than that applied during the growth process of the graphene described later. In particular, the plasma power applied during the pre-treatment process of the substrate 110 may be equal to or greater than about 600 W (e.g., in a range of 600 W to 1600 W).

As the plasma source, for example, a radio frequency (RF) plasma generating apparatus or a microwave (MW) plasma generating apparatus may be used. The RF plasma generating apparatus may generate RF plasma having, for example, a frequency range of about 3 to 100 MHz and the MW plasma generating apparatus may generate MW plasma having, for example, a frequency range of about 0.7 to 2.5 GHz. However, the frequency range is only an example, and another frequency range may be used. Meanwhile, as the plasma source, a plurality of RF plasma generating apparatuses or a plurality of MW plasma generating apparatuses may be used.

When the plasma power equal to or greater than about 600 W is applied into the process chamber while the pre-treatment gas is injected into the process chamber, gas plasma (for example, hydrogen plasma) may be generated inside the process chamber. In this case, an electron temperature around the substrate 110 may be, for example, about 2 eV or higher and ion density may be, for example, about $5 \times 10^{13}/m^3$ or higher. However, the present disclosure is not limited thereto.

As such, when the plasma power equal to or greater than 600 W is applied into the process chamber, a bonding site inducing a covalent bond with carbon 115 of FIG. 5 may be formed on the surface of the substrate 110. Here, the bonding site may induce a covalent bond of a material of the substrate 110 and the carbon 115 of the graphene during the growth process of the graphene described later. Such a bonding site may be partially formed on the surface of the substrate 110. However, the bonding site is not limited thereto and may be formed throughout the surface of the substrate 110.

Figure 4:
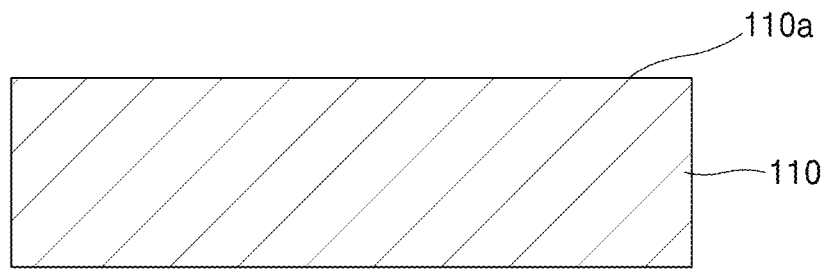

Also, when the gas plasma is generated inside the process chamber, an activation site inducing adsorption of the carbon 115 may be formed on a surface 110a (e.g., upper surface) of the substrate 110, as shown in FIG. 4. In particular, when the gas plasma is generated inside the process chamber into which the pre-treatment gas is injected, certain charges may move towards the substrate 110 and collide with the surface 110a of the substrate 110 inside the process chamber. Accordingly, the activation site for inducing the adsorption of the carbon 115 may be formed on the surface 110a of the substrate 110.

Meanwhile, a certain bias voltage may be further applied to the substrate 110 during the pre-treatment process of the substrate 110. As such, when the bias voltage is applied to the substrate 110, charges inducing the adsorption of the carbon 115 may be formed on the surface 110a of the substrate 110. For example, when the gas plasma is generated while a negative bias voltage is applied to the substrate 110, positive charges may be formed on the surface 110a of the substrate 110, and when the gas plasma is generated while a positive bias voltage is applied to the substrate 110, negative charges may be formed on the surface 110a of the substrate 110.

In the current embodiment, by forming the bonding site inducing the covalent bond with the carbon 115 on the surface of the substrate 110 by using the plasma power equal to or greater than 600 W during the pre-treatment process of the substrate 110, a bonding region 120 in which the material of the substrate 110 and the carbon 115 of the graphene are covalently bonded may be formed between the surface 110a of the substrate 110 and the graphene layer 130 during an initial operation of the growth process of the graphene as described later.

A processing temperature and process pressure inside the process chamber during the pre-treatment process of the substrate 110 may vary according to a growth condition of the graphene. For example, the pre-treatment process of the substrate 110 may be performed at a relatively low temperature. For example, the pre-treatment process of the substrate 110 may be performed at a processing temperature lower than or equal to about 1000° C. In particular, the pre-treatment process of the substrate 110 may be performed at the processing temperature lower than or equal to about 700° C. (for example, about 300° C. to 600° C.). Also, the process pressure at which the pre-treatment process of the substrate 110 is performed may be, for example, lower than that at which the growth process of the graphene described later is performed. However, the process pressure is not limited thereto and the process pressure at which the pre-treatment process of the substrate 110 is performed may vary according to the growth condition of the graphene. For example, the process pressure at which the pre-treatment process of the substrate 110 is performed may be about 0.02 to 5.0 Torr.

Hereinafter, a process of growing the graphene layer 130 of FIG. 6 on the surface 110a of the substrate 110 on which the pre-treatment process of the substrate 110 is performed as described above, by using a plasma enhanced chemical vapor deposition (PECVD) process will be described with reference to FIGS. 3 to 6.

Figure 3:
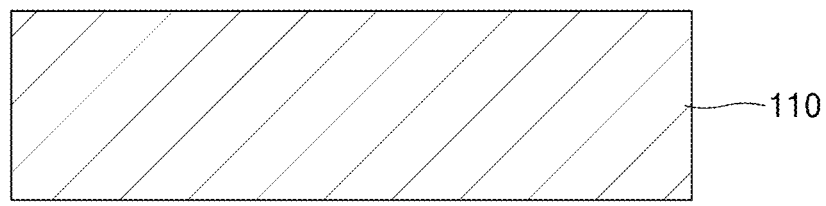

Referring to FIG. 3, after the pre-treatment process of the substrate 110 is completed, a reaction gas for growing the graphene is injected into the process chamber. The reaction gas may include a carbon source. Here, the carbon source may be a source supplying carbon for growing the graphene.

The carbon source may include, for example, at least one of a hydrocarbon gas and vapor of a liquid precursor containing carbon. Here, the hydrocarbon gas may include, for example, a methane gas, an ethylene gas, an acetylene gas, or a propylene gas. Also, the liquid precursor containing carbon may include, for example, benzene, toluene, xylene or anisole, hexane, octane, isopropyl alcohol, or ethanol, or a combination thereof. However, materials of the carbon source stated above are only examples and other various materials may be used as the materials of the carbon source.

The reaction gas may further include at least one of an inert gas and a hydrogen gas. The insert gas may include, for example, at least one of an argon gas, a neon gas, a nitrogen gas, a helium gas, a krypton gas, and a xenon gas, or a combination thereof. FIG. 3 illustrates an example in which the reaction gas includes the carbon source, the insert gas, and the hydrogen gas, the acetylene gas is used as the carbon source, and the argon gas is used as the insert gas. Meanwhile, a mixture ratio of the reaction gas injected into the process chamber may vary according to the growth condition of the graphene.

Referring to FIG. 4, power for generating plasma is applied into the process chamber from the plasma source (not shown). Plasma power applied during the growth process of the graphene may be relatively smaller than that applied during the pre-treatment process of the substrate 110. For example, the plasma power applied during the growth process of the graphene may be lower than 600 W (e.g., in range of 100 W to 600 W), and more specifically, may be equal to or lower than 300 W. However, this is only an example.

As the plasma source, for example, an RF plasma generating apparatus or an MW plasma generating apparatus may be used. The RF plasma generating apparatus may generate RF plasma having, for example, a frequency range of about 3 to 100 MHz, and the MW plasma generating apparatus may generate MW plasma having, for example, a frequency range of about 0.7 to 2.5 GHz. However, the frequency range is only an example and another frequency range may be used. Meanwhile, as the plasma source, a plurality of RF plasma generating apparatuses or a plurality of MW plasma generating apparatuses may be used.

When power for generating plasma is applied into the process chamber from the plasma source, plasma of the reaction gas may be generated inside the process chamber. Also, the carbon 115 activated as will be described later may be formed inside the process chamber by the plasma of the reaction gas.

A processing temperature and process pressure inside the process chamber during the growth process of the graphene may vary according to a growth condition of the graphene. For example, the growth process of the graphene may be performed at a relatively low temperature, like the pre-treatment process of the substrate 110. For example, the growth process of the graphene may be performed at a processing temperature lower than or equal to about 1000° C. In particular, the growth process of the graphene may be performed at a processing temperature lower than or equal to about 700° C. (for example, about 300° C. to 600° C.)

The process pressure at which the growth process of the graphene is performed may be, for example, higher than that at which the pre-treatment process of the substrate 110 described above is performed. However, the process pressure is not limited thereto and the process pressure at which the growth process of the graphene is performed may vary according to the growth condition of the graphene.

Referring to FIG. 5, when the plasma power is applied into the process chamber, the carbon 115 activated by the plasma of the reaction gas generated and the carbon 115 generated as such moves towards the surface 110a of the substrate 110. As described above, because the bonding site capable of inducing a covalent bond with the carbon 115 is formed on the surface 110a of the substrate 110 via the pre-treatment process of the substrate 110 using the plasma power equal to or greater than 600 W, the carbon 115 moving towards the surface of the substrate 110 may covalently bond with the material of the substrate 110 in the bonding site, thereby forming a bonding region 120. Such a bonding region 120 may cover a part or all of the surface of the substrate 110.

For example, when the substrate 110 is a Si substrate, a bonding region including an Si—C bond in which Si and C are covalently bonded may be formed on a surface of the Si substrate. Here, the Si—C bond in which the material of the substrate 110 and the carbon 115 are covalently bonded may strongly bond the graphene layer 130 grown thereon to the surface 110a of the substrate 110 via a strong bonding force of the covalent bond.

Meanwhile, the activation site or charges capable of inducing adsorption of the carbon 115 are formed on the surface of the substrate 110 via the pre-treatment process of the substrate 110, and the carbon 115 moving towards the surface of the substrate 110 may be effectively adsorbed on the surface of the substrate 110.

After the bonding region 120 in which the material of the substrate 110 and the carbon 115 are covalently bonded is formed on the surface 110a of the substrate 110, the carbon 115 is continuously adsorbed on the surface 110a of the substrate 110, thereby growing the graphene on the surface 110a of the substrate 110. Then, when the growth process of the graphene is completed, a graphene layer 130 may be formed on the surface 110a of the substrate 110 at a certain thickness, as shown in FIG. 6. Here, the bonding region 120 in which the material of the substrate 110 and the carbon are covalently bonded is formed between the graphene layer 130 and the substrate 110, and thus, the graphene layer 130 may be strongly adhered to the surface 110a of the substrate 110.

Also, when the graphene layer 130 is formed thinly while characteristics desired and/or required in the graphene layer 130 are maintained during the growth process of the graphene, the adhesion between the graphene layer 130 and the substrate 110 may be further increased. For example, by forming the graphene layer 130 to a thickness of, for example, about 1 nm to 2 nm during the growth process of the graphene, the adhesion between the graphene layer 130 and the substrate 110 may be further increased. However, this is only an example and the graphene layer 130 may have any thickness.

In order to apply graphene to a semiconductor device, graphene may be directly grown on a surface of a semiconductor substrate such as an Si substrate in terms of processability. However, in general, when graphene is directly grown on a surface of a semiconductor substrate, bonding between the graphene and the semiconductor substrate depends mainly on relatively weak van der Waals interaction, and thus, adhesion between the graphene and the semiconductor substrate is reduced. As such, when the adhesion between the graphene and the semiconductor substrate is small, a peeling phenomenon in which the graphene is detached from the semiconductor substrate due to process stress generated during a semiconductor process (for example, a chemical mechanical polishing (CMP) process) may occur.

In the method of forming a graphene structure, according to the current embodiment, the plasma power equal to or greater than about 600 W is used in the pre-treatment process of the substrate 110 and the graphene layer 130 is grown on the surface of the substrate 110 in the growth process of the graphene, thereby forming the bonding region 120 in which the material of the substrate 110 and the carbon 115 are covalently bonded between the graphene layer 130 and the substrate 110. Here, the graphene layer 130 may be strongly adhered to the surface 110a of the substrate 110 via a strong bonding force of the covalent bond. Also, by forming the graphene layer 130 as thin as possible with a thickness of about 1 nm to 2 nm, the adhesion of the graphene layer 130 to the substrate 110 may be further increased. Accordingly, when a semiconductor device is to be manufactured by directly growing graphene on a semiconductor substrate, graphene having improved adhesion may be formed on the semiconductor substrate. Also, the graphene may be formed via a relatively low temperature process of, for example, about 1000° C. or lower (for example, 700° C. or lower) by using a PECVD process.

Figure 7:
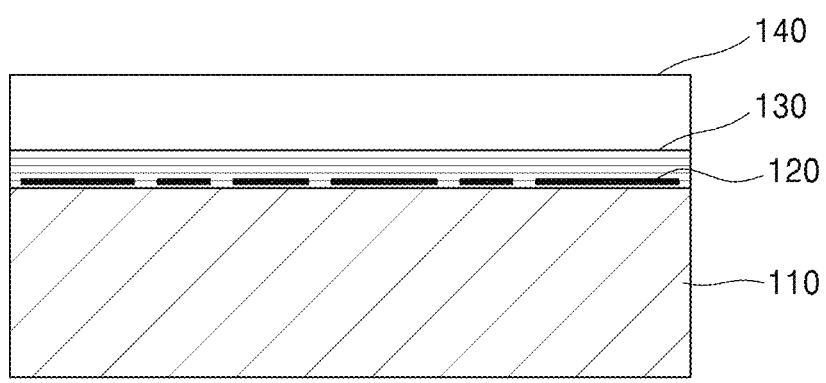
FIG. 7 is a view of a metal layer deposited on a top surface of a graphene layer of FIG. 6.

FIG. 7 illustrates a metal layer 140 deposited on the graphene layer 130 of FIG. 6, as an example in which the graphene is applied to the semiconductor device. Here, the graphene layer 130 may be used as, for example, a barrier layer of the metal layer 140. The graphene layer 130 may be strongly adhered to the substrate 110 by the bonding region 120 in which the material of the substrate 110 and the carbon 115 are covalently bonded and formed between the substrate 110 and the graphene layer 130. By forming the graphene layer 130 to a small thickness of about 1 nm to 2 nm, the adhesion between the graphene layer 130 and the substrate 110 may be further increased.

Figure 8:
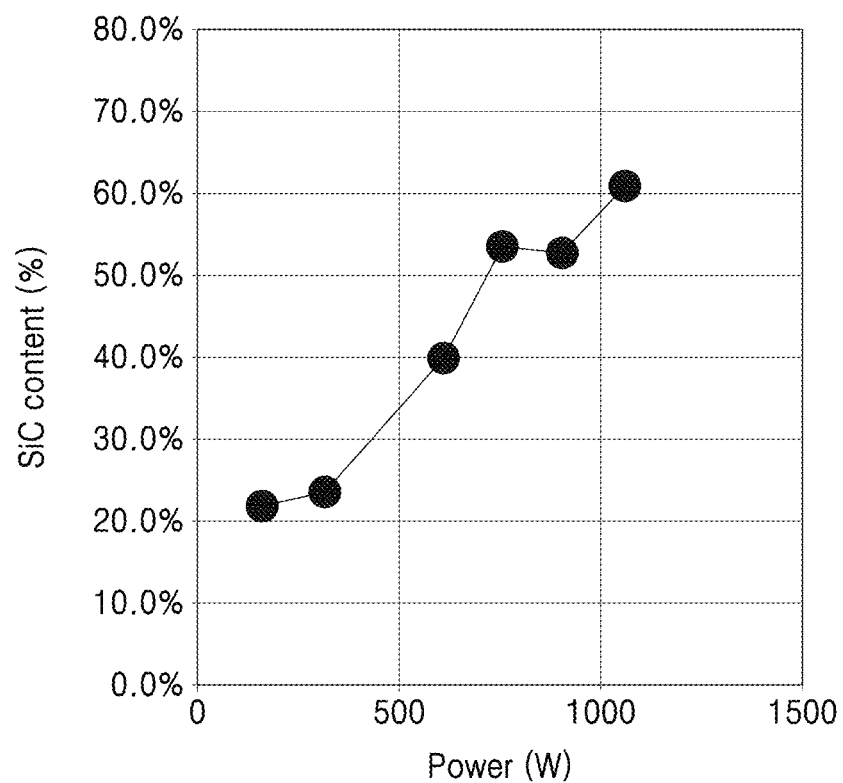
FIG. 8 is a graph showing content of silicon-carbon (Si—C) bond according to plasma power in a pre-treatment process of a Si substrate.

FIG. 8 is a graph showing content of a silicon-carbon (Si—C) bond according to plasma power in a pre-treatment process of a Si substrate. A pre-treatment process using hydrogen plasma and a growth process of graphene using PECVD are performed on a surface of the Si substrate, and FIG. 8 shows the content of Si—C bond in which Si and C are covalently bonded and formed on a surface of the Si substrate according to plasma power used during the pre-treatment process of the Si substrate.

Referring to FIG. 8, the content of Si—C bond is increased as the plasma power is increased. As such, when the content of Si—C bond is increased, adhesion between the Si substrate and the graphene may be increased.

Figure 9:
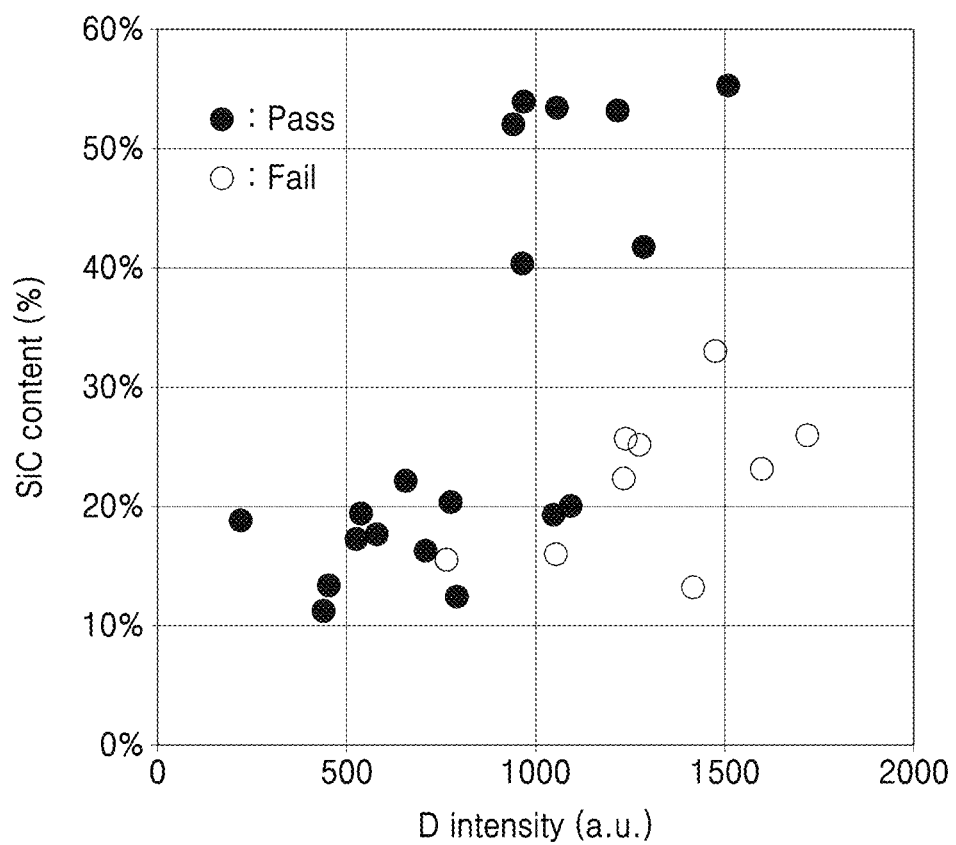
FIG. 9 is a graph showing an adhesion test result of graphene according to thickness of the graphene.

FIG. 9 is a graph showing an adhesion test result of graphene according to thickness of the graphene. FIG. 9 illustrates a result of performing a peeling test on graphene directly grown on a Si substrate. In FIG. 9, the x-axis denotes D intensity of Raman spectrum that may correspond to a thickness of the graphene. Also, in FIG. 9, "pass" indicates that the graphene is not detached from the Si substrate as a result of the peeling test and "fail" indicates that the graphene is detached from the Si substrate as a result of the peeling test. Referring to FIG. 9, when the content of Si—C bond is similar, the graphene having a relatively small thickness has stronger adhesion to the Si substrate.

FIGS. 10 through 16 are views for describing a method of forming a graphene structure, according to another embodiment.

Figure 10:
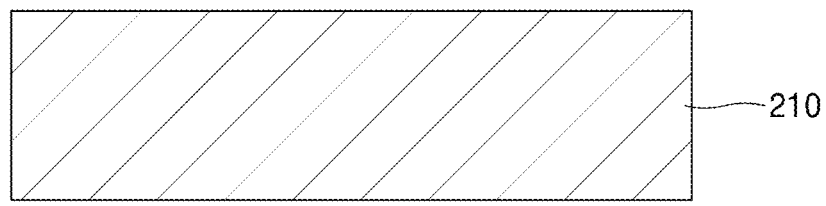
FIGS. 10 through 16 are views for describing a method of forming a graphene structure, according to another embodiment.
Figure 11:
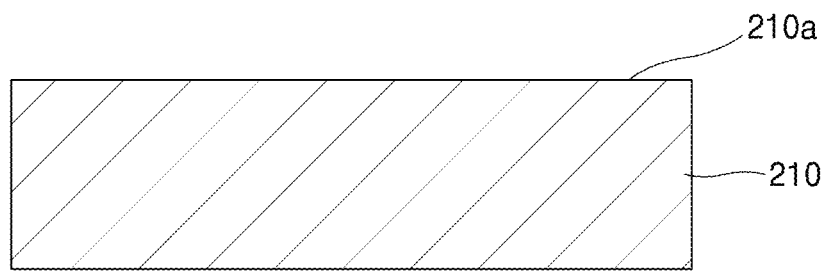
Figure 15:
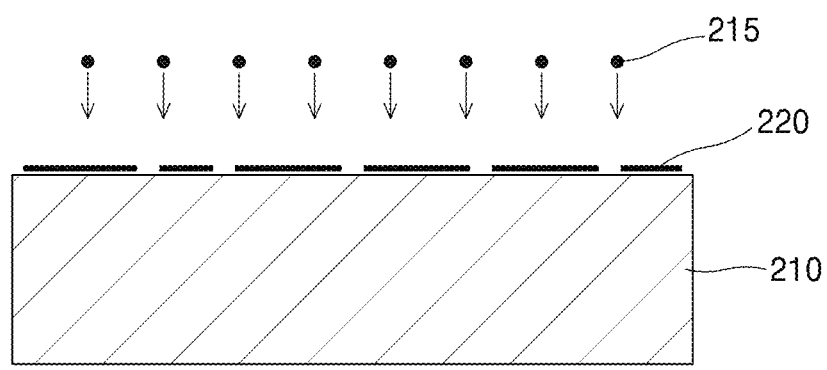
Figure 16:
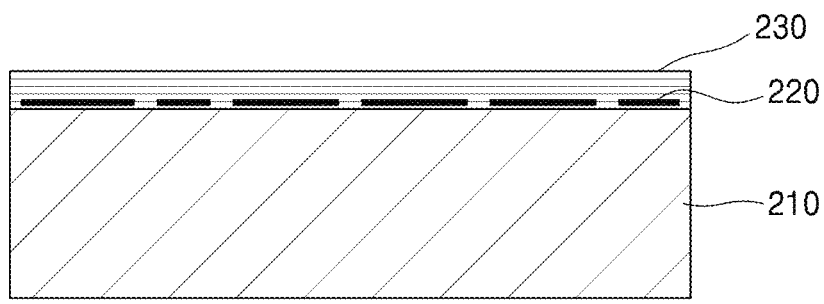

The method according to the current embodiment includes a pre-treatment process of a substrate 210 of FIG. 10, in which a surface of the substrate 210 is treated, and a growth process of graphene, in which a graphene layer 230 of FIG. 16 is grown on the surface of the substrate 210. In FIGS. 10 and 11, the pre-treatment process of the substrate 210 is illustrated and in FIGS. 12 through 16, the growth process of the graphene is illustrated.

Hereinafter, the pre-treatment process of the substrate 210 will be described first with reference to FIGS. 10 and 11.

Referring to FIG. 10, a certain pre-treatment gas is injected into a process chamber (not shown) where the substrate 210 is provided. The substrate 210 may include a material capable of forming a covalent bond with carbon. The substrate 210 may include, for example, a semiconductor material. Here, the semiconductor material may include, for example, a Group IV semiconductor material or a semiconductor compound. In particular, the substrate 210 may include Si. However, this is only an example and the substrate 210 may include other various semiconductor materials. The substrate 210 may further include a dopant. Meanwhile, the substrate 210 may include a metal material.

The pre-treatment gas injected into the process chamber during the pre-treatment process of the substrate 210 may include, for example, at least one of an inert gas, hydrogen, oxygen, ammonia, chlorine, bromine, fluorine, and fluorocarbon. FIG. 10 illustrates an example in which a hydrogen gas is used as the pre-treatment gas.

Referring to FIG. 11, power for generating plasma inside the process chamber is applied from a plasma source (not shown) while the pre-treatment gas is injected into the process chamber. In particular, the plasma power applied during the pre-treatment process of the substrate 210 may be, for example, less than 600 W. As the plasma source, for example, an RF plasma generating apparatus or an MW plasma generating apparatus may be used. Meanwhile, as the plasma source, a plurality of RF plasma generating apparatuses or a plurality of MW plasma generating apparatuses may be used.

When the plasma power is applied into the process chamber while the pre-treatment gas is injected into the process chamber, gas plasma (for example, hydrogen plasma) may be generated inside the process chamber. Also, when the gas plasma is generated inside the process chamber, an activation site inducing adsorption of carbon 215 of FIG. 14 may be formed on a surface 210*a* (e.g., upper surface) of the substrate 210. Also, a certain bias voltage may be further applied to the substrate 210 during the pre-treatment process of the substrate 210. As such, when the bias voltage is applied to the substrate 210, charges inducing the adsorption of the carbon 215 may be formed on the surface 210*a* of the substrate 210.

A processing temperature and process pressure inside the process chamber during the pre-treatment process of the substrate 210 may vary according to a growth condition of the graphene. For example, the pre-treatment process of the substrate 210 may be performed at a relatively low temperature. For example, the pre-treatment process of the substrate 210 may be performed at a processing temperature lower than or equal to about 1000° C. In particular, the pre-treatment process of the substrate 210 may be performed at a processing temperature lower than or equal to about 700° C. (for example, about 300° C. to 600° C.).

Hereinafter, a process of growing the graphene layer 230 of FIG. 16 on the surface 210*a* of the substrate 210 on which the pre-treatment process of the substrate 210 described above is performed, by using a PECVD process, will be described with reference to FIGS. 12 through 16.

Figure 12:
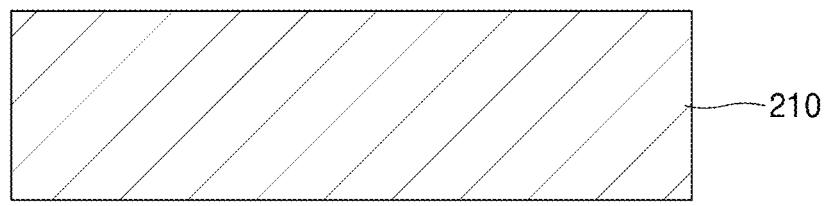

Referring to FIG. 12, after the pre-treatment process of the substrate 210 is completed, a reaction gas for growing the graphene is injected into the process chamber. The reaction gas may include a carbon source. The carbon source may include, for example, at least one of a hydrocarbon gas and vapor of a liquid precursor including carbon. Here, the hydrocarbon gas may include, for example, a methane gas, an ethylene gas, an acetylene gas, or a propylene gas, or a combination thereof. Also, the liquid precursor containing carbon may include, for example, benzene, toluene, xylene or anisole, hexane, octane, isopropyl alcohol, or ethanol. However, materials of the carbon source stated above are only examples and other various materials may be used as the materials of the carbon source.

The reaction gas may further include at least one of an inert gas and a hydrogen gas. The insert gas may include, for example, at least one of an argon gas, a neon gas, a nitrogen gas, a helium gas, a krypton gas, and a xenon gas. FIG. 12 illustrates an example in which the reaction gas includes the carbon source, the insert gas, and the hydrogen gas, the acetylene gas is used as the carbon source, and the argon gas is used as the insert gas. Meanwhile, a mixture ratio of the reaction gas injected into the process chamber may vary according to the growth condition of the graphene.

Figure 13:
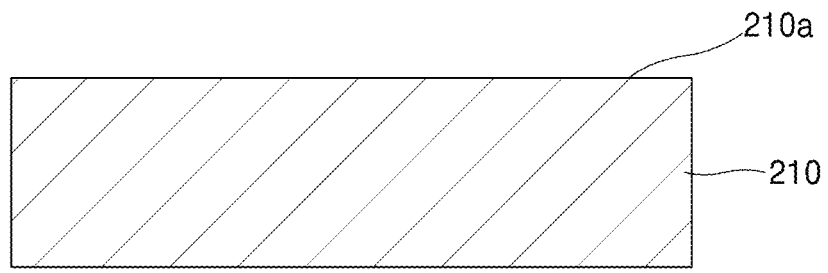

Referring to FIG. 13, power for generating first plasma is applied into the process chamber from the plasma source (not shown). Here, first plasma power applied during an initial operation of the growth process of the graphene may be relatively greater than that applied during the pre-treatment process of the substrate 210. For example, the first plasma power may be equal to or greater than about 600 W (e.g., in a range of 600 W to 1600 W).

As the plasma source, for example, an RF plasma generating apparatus or an MW plasma generating apparatus may be used. Meanwhile, as the plasma source, a plurality of RF plasma generating apparatuses or a plurality of MW plasma generating apparatuses may be used.

A processing temperature and process pressure inside the process chamber during the initial operation of the growth process of the graphene may vary according to a growth condition of the graphene. For example, the growth process of the graphene may be performed at a relatively low temperature like the pre-treatment process of the substrate 210. For example, the growth process of the graphene may be performed at a processing temperature lower than or equal to about 1000° C. In particular, the growth process of the graphene may be performed at a processing temperature lower than or equal to about 700° C. (for example, about 300° C. to 600° C.) Meanwhile, the process pressure at which the growth process of the graphene is performed may vary according to a growth condition of the graphene.

Figure 14:
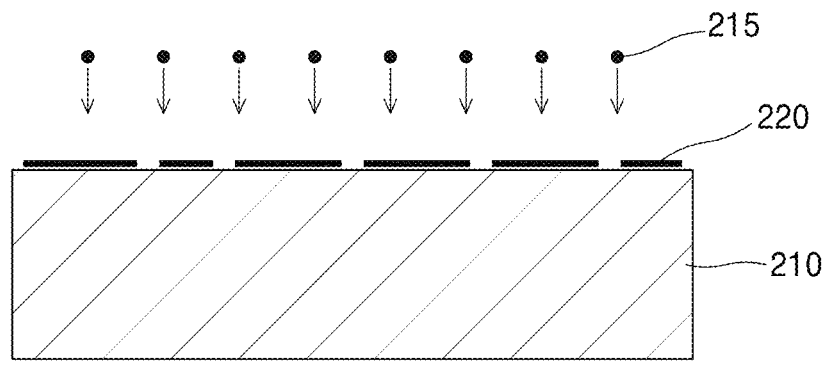

Referring to FIG. 14, when the first plasma power is applied into the process chamber from the plasma source, the first plasma of the reaction gas may be generated inside the process chamber. In this case, an electron temperature around the substrate 210 may be, for example, about 2 eV or higher and ion density may be, for example, about $5 \times 10^{13}/m^3$ or higher. However, the present disclosure is not limited thereto.

As such, when the plasma power equal to or greater than 600 W is applied into the process chamber, a bonding site inducing a covalent bond with the carbon 215 may be formed on a surface of the substrate 210. Here, the bonding site may induce the covalent bond of a material of the substrate 210 and the carbon 215 of the graphene. Such a bonding site may be partially formed on the surface of the substrate 210. However, the bonding site is not limited thereto, and may be formed throughout the surface of the substrate 210.

Also, the carbon 215 activated by the first plasma of the reaction gas is generated and the carbon 215 generated as such moves towards the surface 210a of the substrate 210. As described above, because the bonding site capable of inducing a covalent bond with the carbon 215 is formed on the surface 210a of the substrate 210 by using the first plasma power equal to or greater than 600 W during the initial operation of the growth process of the graphene the carbon 215 moving towards the surface of the substrate 210 may covalently bond with the material of the substrate 210 in the bonding site, thereby forming a bonding region 220. Such a bonding region 220 may cover a part or all of the surface of the substrate 210.

For example, when the substrate 210 is a Si substrate, a bonding region 220 including an Si—C bond in which Si and C are covalently bonded may be formed on a surface of the Si substrate. Here, the bonding region 220 in which the material of the substrate 210 and the carbon 215 are covalently bonded may strongly bond the graphene layer 230 grown thereon to the surface 210a of the substrate 210 via a strong bonding force of the covalent bond.

Meanwhile, the activation site or charges capable of inducing adsorption of the activated carbon 215 are formed on the surface 210a of the substrate 210 via the pre-treatment process of the substrate 210, and thus, the activated carbon 215 may be effectively adsorbed on the surface 210a of the substrate 210.

Referring to FIG. 15, after the bonding region 220 in which the material of the substrate 210 and the carbon 215 are covalently bonded is formed on the surface 210a of the substrate 210, power for generating second plasma is applied into the process chamber from a plasma source (not shown). Here, the second plasma power may be relatively less than the first plasma power described above. For example, the second plasma power may be less than about 600 W (e.g., in range of 100 W to 600 W). Also, the processing temperature and the process pressure inside the process chamber may be the same as the initial operation of the growth process of the graphene. However, the present disclosure is not limited thereto.

When second plasma power is applied into the process chamber from the plasma source, second plasma of the reaction gas may be generated inside the process chamber. Also, the activated carbon 215 generated by the second plasma of the reaction gas moves and is adsorbed to the surface 210a of the substrate 210, and thus, graphene may be grown on the surface 210a of the substrate 210. Then, when the growth process of the graphene is completed, the graphene layer 230 may be formed on the surface 210a of the substrate 210 at a certain thickness, as shown in FIG. 16. Here, the bonding region 220 in which the material of the substrate 210 and the carbon 215 are covalently bonded is formed between the graphene layer 230 and the substrate 210, and thus, the graphene layer 230 may be strongly adhered to the surface 210a of the substrate 210.

Also, when the graphene layer 230 is formed thinly while characteristics desired and/or required in the graphene layer 230 are maintained during the growth process of the graphene, the adhesion between the graphene layer 230 and the substrate 210 may be further increased. For example, by forming the graphene layer 230 to a thickness of, for example, about 1 nm to 2 nm during the growth process of the graphene, the adhesion between the graphene layer 230 and the substrate 210 may be further increased.

In the method according to the current embodiment, the bonding region 220 in which the material of the substrate 210 and the carbon 215 are covalently bonded is formed by using plasma power equal to or greater than about 600 W during the initial operation of the growth process of the graphene, and then the graphene layer 230 may be grown thereon. Accordingly, the graphene layer 230 may be strongly adhered to the surface 210a of the substrate 210 by strong adhesion of the covalent bond formed between the material of the substrate 210 and the carbon 215 of the graphene. Also, by forming the graphene layer 230 as thin as possible with the thickness of about 1 nm to 2 nm, the adhesion of the graphene layer 230 to the substrate 210 may be further increased. Accordingly, when a semiconductor device is to be manufactured by directly growing graphene on a semiconductor substrate, graphene having improved adhesion may be formed on the semiconductor substrate. Also, graphene may be formed via a relatively low temperature process of, for example, about 1000° C. or lower (for example, 700° C. or lower) by using a PECVD process.

Meanwhile, the method described in the above embodiment includes the pre-treatment process of the substrate 210 shown in FIGS. 10 and 11 and the growth process of the graphene shown in FIGS. 12 through 16, but the pre-treatment process of the substrate 210 shown in FIGS. 10 and 11 may be omitted.

Referring to FIGS. 12-16, the reaction gas with the first plasma for forming the bonding region 220 may be the same as or different than the reaction gas with the second plasma for forming the graphene layer 230. For example, the reaction gas with the first plasma for forming the bonding region 220 may include a first carbon source that is the same as or different than a second carbon source in the reaction gas for forming the graphene layer 230 with the second plasma.

Figure 17:
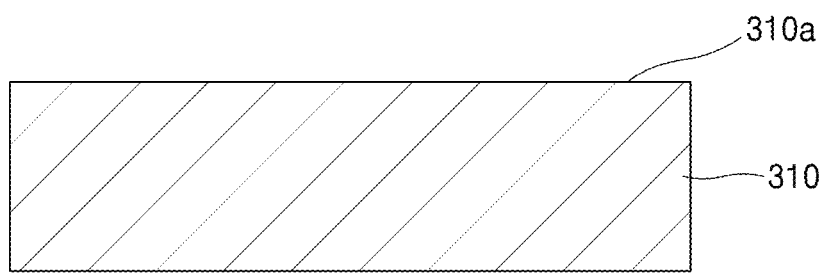
FIGS. 17 through 19 are views for describing a method of forming a graphene structure, according to another embodiment.
Figure 18:
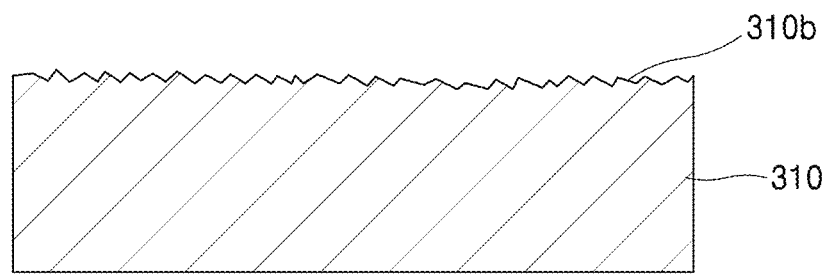
Figure 19:
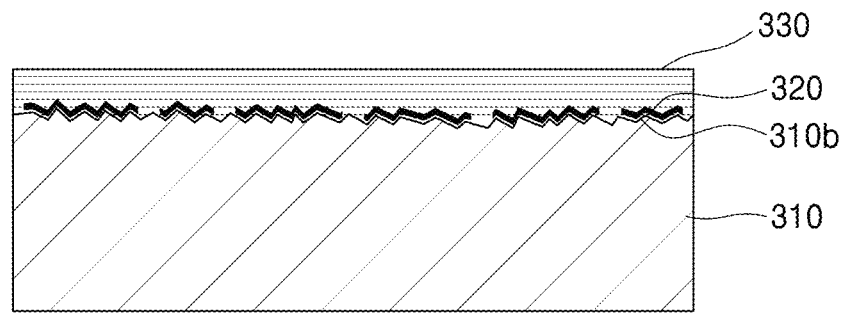

FIGS. 17 through 19 are views for describing a method of forming a graphene structure, according to another embodiment.

The method according to the current embodiment may include a process of forming roughness 310b on a surface 310a (e.g., upper surface) of a substrate 310. FIGS. 17 and 18 illustrate a process of forming the roughness 310b on the surface 310a of the substrate 310.

Referring to FIGS. 17 and 19, the substrate 310 is prepared. The substrate 310 may include a material capable of forming a carbide via a covalent bond with carbon. The substrate 310 may include, for example, a semiconductor material. Here, the semiconductor material may include, for example, a Group IV semiconductor material or a semiconductor compound. The substrate 310 may further include a dopant. Also, the substrate 310 may include a metal material.

Then, the roughness 310b of a nano size is formed on the surface 310a of the substrate 310. Such roughness 310b may be formed via, for example, an ion bombardment process or a wet etching process. For example when the substrate 310 is silicon, potassium hydroxide (KOH) or tetra-methyl-ammonium hydroxide (TMAH) may be used for form the roughened surface 310b of a silicon substrate 310, but example embodiments are not limited thereto. FIG. 17 illustrates an example in which the ion bombardment process is performed on the surface 310a of the substrate 310. As such, when the roughness 310b of the nano size is formed on the surface 310a of the substrate 310, a surface area of the substrate 310 on which graphene layer 330 of FIG. 19 may be grown may be increased.

After the roughness 310b is formed on the surface 310a of the substrate 310, a pre-treatment process of the substrate 310, in which the surface 310a of the substrate 310 on which the roughness 310b is formed is treated, and a growth process of graphene, in which graphene is grown on a surface of the substrate 310, may be performed.

As an example of the current embodiment, the pre-treatment process of the substrate 310 may be identical to that shown in FIGS. 1 and 2, and the growth process of graphene may be identical to that shown in FIGS. 3 through 6. The pre-treatment process and the growth process may be summarized as follows.

During the pre-treatment process of the substrate 310, a certain pre-treatment gas is injected into a process chamber in which the substrate 310 is provided, and then power for generating plasma is applied into the process chamber from a plasma source. Plasma power applied during the pre-treatment process of the substrate 310 may be relatively greater than that applied during the growth process of the graphene. In particular, the plasma power applied during the pre-treatment process of the substrate 310 may be equal to or greater than about 600 W (e.g., in a range of 600 W to 1600 W).

When the plasma power equal to or greater than about 600 W is applied into the process chamber while the pre-treatment gas is injected into the process chamber, gas plasma may be generated inside the process chamber. As such, when the plasma power equal to or greater than 600 W is applied into the process chamber, a bonding site inducing a covalent bond with carbon may be formed on a surface of the substrate 310. Such a bonding site may be partially formed on the surface of the substrate 310. However, the bonding site is not limited thereto, and may be formed throughout the surface of the substrate 310.

Also, when the gas plasma is generated inside the process chamber, an activation site capable of inducing adsorption of activated carbon may be formed on the surface 310a of the substrate 310. Also, a certain bias voltage may be applied to the substrate 310 during the pre-treatment process of the substrate 310, and in this case, charges inducing adsorption of the activated carbon may be formed on the surface 310a of the substrate 310.

For example, the pre-treatment process of the substrate 310 may be performed at a relatively low temperature. For example, the pre-treatment process of the substrate 310 may be performed at the processing temperature lower than or equal to about 1000° C. In particular, the pre-treatment process of the substrate 310 may be performed at the processing temperature lower than or equal to about 700° C. (for example, about 300° C. to 600° C.).

During the growth process of the graphene, a reaction gas for growing graphene is injected into the process chamber, and then power for generating plasma is applied into the process chamber from a plasma source. Plasma power applied during the growth process of the graphene may be relatively less than that applied during the pre-treatment process of the substrate 310. For example, the plasma power applied during the growth process of the graphene may be lower than 600 W (e.g., in range of 100 to 600 W), and more specifically, may be equal to or lower than 300 W. However, this is only an example.

When power for generating plasma is applied into the process chamber from the plasma source, plasma of the reaction gas may be generated inside the process chamber. A processing temperature and process pressure inside the process chamber during the growth process of the graphene may vary according to a growth condition of the graphene. For example, the growth process of the graphene may be performed at a relatively low temperature, like the pre-treatment process of the substrate 310. For example, the growth process of the graphene may be performed at the processing temperature lower than or equal to about 1000° C. For example, the growth process of the graphene may be performed at the processing temperature lower than or equal to about 700° C.

When plasma power is applied into the process chamber, the carbon activated by the plasma of the reaction gas is generated and the carbon generated as such moves towards the surface 310a of the substrate 310. Because a bonding site capable of inducing a covalent bond with the carbon is formed on the surface 310a of the substrate 310 by using the plasma power equal to or greater than 600 W during the pre-treatment process of the substrate 310, the carbon moving towards the surface 310a of the substrate 310 covalently bonds with a material of the substrate 310 in the bonding site, thereby forming a bonding region 320. Such a bonding region 320 may cover a part or all of the surface of the substrate 310.

Meanwhile, an activation site or charges capable of inducing adsorption of the activated carbon are formed on the surface 310a of the substrate 310 via the pre-treatment process of the substrate 310, and thus, the activated carbon may be effectively adsorbed on the surface 310a of the substrate 310.

After the bonding region 320 in which the material of the substrate 310 and the carbon are covalently bonded is formed on the surface 310a of the substrate 310, the carbon is continuously adsorbed on the surface 310a of the substrate 310, thereby growing the graphene on the surface 310a of the substrate 310. Also, after the growth process of the graphene is completed, the graphene layer 330 having a certain thickness may be formed on the surface 310a of the substrate 310. Here, the bonding region 320 in which the material of the substrate 310 and the carbon are covalently bonded is formed between the graphene layer 330 and the substrate 310, and thus, the graphene layer 330 may be strongly adhered to the surface 310a of the substrate 310. For example, when the graphene layer 330 is formed to have a small thickness of, for example, about 1 nm to 2 nm, adhesion between the graphene layer 330 and the substrate 310 may be further increased.

As another example of the current embodiment, the pre-treatment process of the substrate 310 may be identical to that shown in FIGS. 10 and 11, and the growth process of graphene may be identical to that shown in FIGS. 12 through 16. The pre-treatment process and the growth process may be summarized as follows.

During the pre-treatment process of the substrate 310, a certain pre-treatment gas is injected into a process chamber in which the substrate 310 is provided, and then power for generating plasma is applied into the process chamber from a plasma source. The plasma power applied during the pre-treatment process of the substrate 310 may be, for example, less than 600 W.

When the plasma power is applied into the process chamber while the pre-treatment gas is injected into the process chamber, gas plasma may be generated inside the process chamber. Also, when the gas plasma is generated inside the process chamber, an activation site inducing adsorption of activated carbon may be formed on the surface 310a of the substrate 310. Also, a certain bias voltage may be applied to the substrate 310 during the pre-treatment process of the substrate 310, and in this case, charges inducing adsorption of the activated carbon may be formed on the surface 310a of the substrate 310. The pre-treatment process of the substrate 310 may be performed at a relatively low temperature. For example, the pre-treatment process of the substrate 310 may be performed at a processing temperature lower than or equal to about 1000° C. In particular, the pre-treatment process of the substrate 310 may be performed at a processing temperature lower than or equal to about 700° C. (for example, about 300° C. to 600° C.).

During the growth process of the graphene, the reaction gas for growing the graphene is injected into the process chamber where the substrate 310 is prepared. Here, power for generating first plasma is applied into the process chamber from the plasma source. Here, first plasma power applied during an initial operation of the growth process of the graphene may be relatively greater than that applied during the pre-treatment process of the substrate 310. For example, the first plasma power may be equal to or greater than about 600 W.

A processing temperature and process pressure inside the process chamber during the initial operation of the growth process of the graphene may vary according to a growth condition of the graphene. For example, the growth process of the graphene may be performed at a relatively low temperature like the pre-treatment process of the substrate 310. For example, the growth process of the graphene may be performed at a processing temperature lower than or equal to about 1000° C. For example, the growth process of the graphene may be performed at a processing temperature lower than or equal to about 700° C. Meanwhile, the process pressure at which the growth process of the graphene may vary according to a growth condition of the graphene.

When the first plasma power is applied into the process chamber from the plasma source, the first plasma of the reaction gas may be generated inside the process chamber. As such, when the plasma power equal to or greater than 600 W is applied into the process chamber, a bonding site inducing a covalent bond with the carbon may be formed on the surface of the substrate 310. Such a bonding site may be partially formed on the surface of the substrate 310.

Also, the carbon activated by the first plasma of the reaction gas is generated and the carbon generated as such moves towards the surface 310a of the substrate 310. As described above, because the bonding site capable of inducing a covalent bond with the carbon is formed on the surface 310a of the substrate 310 by using the first plasma power equal to or greater than 600 W during the initial operation of the growth process of the graphene, the carbon moving towards the surface of the substrate 310 may covalently bond with the material of the substrate 310 in the bonding site, thereby forming the bonding region 320. Such a bonding region 320 may cover a part or all of the surface of the substrate 310. Here, the bonding region 320 in which the material of the substrate 310 and the carbon are covalently bonded may strongly bond the graphene layer 330 grown thereon to the surface 310a of the substrate 310 via a strong bonding force of the covalent bond.

Meanwhile, the activation site or charges capable of inducing adsorption of the activated carbon are formed on the surface 310a of the substrate 310 via the pre-treatment process of the substrate 310, and thus the activated carbon may be effectively adsorbed on the surface 310a of the substrate 310.

After forming the bonding region 320 in which the material of the substrate 310 and the carbon are covalently bonded on the surface 310a of the substrate 310, power for generating second plasma is applied into the process chamber from the plasma source. Here, the second plasma power may be relatively less than the first plasma power described above. For example, the second plasma power may be less than about 600 W. Also, the processing temperature and the process pressure inside the process chamber may be the same as the initial operation of the growth process of the graphene. However, the present disclosure is not limited thereto.

When second plasma power is applied into the process chamber from the plasma source, second plasma of the reaction gas may be generated inside the process chamber. Also, the activated carbon generated by the second plasma of the reaction gas moves and is adsorbed to the surface 310a of the substrate 310, and thus, the graphene may be grown on the surface 310a of the substrate 310. Also, after the growth process of the graphene is completed, the graphene layer 330 having a certain thickness may be formed on the surface 310a of the substrate 310. FIG. 19 shows that the bonding region 320 in which the material of the substrate 310 and carbon are covalently bonded is formed on the surface 310a of the substrate 310 having the roughness 310b, and the graphene layer 330 is formed thereon.

According to the current embodiment, adhesion between the substrate 310 and the graphene layer 330 may be improved by forming the bonding region 320 in which the material of the substrate 310 and the carbon are covalently bonded on the surface 310a of the substrate 310. Also, the adhesion between the substrate 310 and the graphene layer 330 may be further increased by increasing the surface area of the substrate 310 by forming the roughness 310b of a nano size on the surface 310a of the substrate 310.

According to the embodiments described above, a bonding region in which a substrate material and carbon are covalently bonded may be formed between a graphene layer and a substrate by using high plasma power equal to or greater than about 600 W during a pre-treatment process of the substrate or an initial operation of growth process of graphene. Here, the graphene layer may be strongly adhered to a surface of the substrate according to a strong bonding force of the covalent bond.

Also, by forming the graphene layer as thin as possible, adhesion of the graphene layer to the substrate may be further increased. Accordingly, when a semiconductor device is to be manufactured by directly growing graphene on a semiconductor substrate, graphene having improved adhesion may be formed on the semiconductor substrate. Also, graphene may be formed via a relatively low temperature process of, for example, about 1000° C. or lower (for example, 700° C. or lower) by using a PECVD process.

Figure 20:
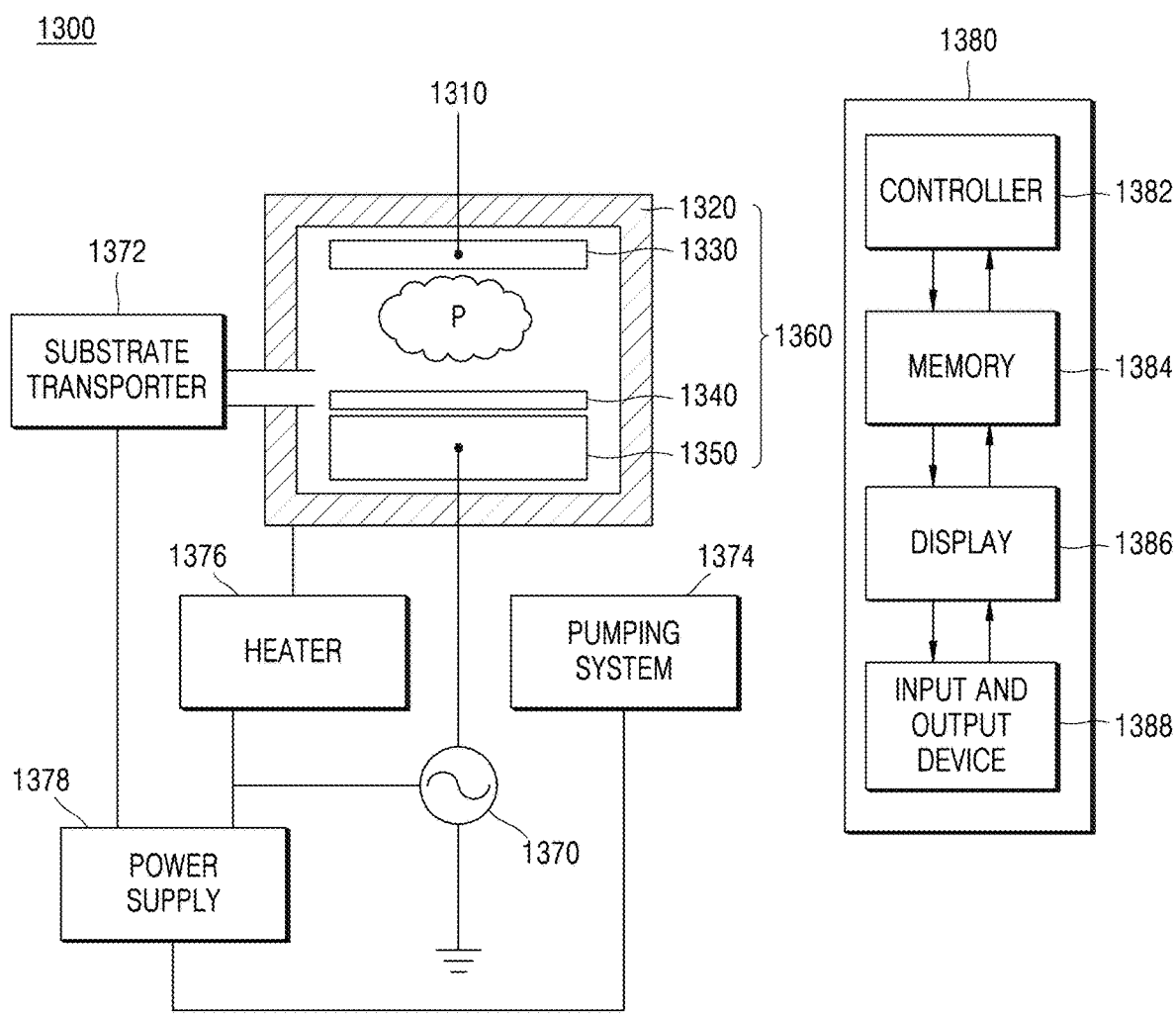
FIG. 20 a cross-sectional view of an apparatus for forming graphene according to some example embodiments.

FIG. 20 a cross-sectional view of an apparatus for forming graphene according to some example embodiments.

Referring to FIG. 20, an apparatus 1300 may include a gas supply 1310, a process chamber 1360, a plasma generation unit 1370, a substrate transporter 1372, a pumping system 1374, a heater 1376, a power supply 1378, and an operation station 1380. The process chamber 1360 may include a chamber housing 1320, an upper electrode 1330 in the chamber housing 1320, and a substrate support 1350 in the chamber housing 1320. The upper electrode 1330 may be connected to a gas supply 1310 with conduits and gas flow controllers for providing reaction gases into the process chamber 1360. The substrate support 1350 may be an electrostatic chuck, but is not limited thereto.

The substrate transporter 1372, such as a robot arm, may transport a substrate 1340 into and out of the process chamber 1360. The process chamber 1360 may include a gate valve that opens when the substrate transporter 1372 transports the substrate 1340 into or out of the process chamber 1360 and closes when the process chamber 1360 performs operations (e.g., vacuum processes). The heater 1376 (e.g., electric heater) may control the temperature of the substrate support 1350, inner wall of process chamber 1360, and upper electrode 1330. The plasma generation unit 1370 may be a RF power generator and may be connected to the substrate support 1350 and may be used to generate a plasma P of a reaction gas in the process chamber 1360. Alternatively, a microwave power supply may be used to generate the plasma P in the process chamber 1360. The pumping system 1374 may be connected to the process chamber 1360 and may create a vacuum in the process chamber 1360. The power supply 1378 (e.g., circuit) may provide electrical power to the apparatus 1300.

The operation station 1380 may control operations of the apparatus 1300. The operation station 1380 may include a controller 1382, a memory 1384, a display 1386 (e.g., monitor), and an input and output device 1388. The memory 1384 may include a nonvolatile memory, such as a flash memory, a phase-change random access memory (PRAM), a magneto-resistive RAM (MRAM), a resistive RAM (Re-RAM), or a ferro-electric RAM (FRAM), and/or a volatile memory, such as a static RAM (SRAM), a dynamic RAM (DRAM), or a synchronous DRAM (SDRAM). The input and output device 1388 may be a keyboard or a touch screen.

The memory 1384 may store an operating system and may store recipe instructions that include settings (e.g., gas flow rates, temperature, time, power, pressure, etc.) for different manufacturing processes performed by the apparatus 1300. The memory 1384 may store recipe instructions for forming a graphene product on the substrate 1340 according to one or more of the embodiments in FIGS. 1 to 6, 10 to 16, and 17 to 19 of the present application.

The controller 1382 may be, a central processing unit (CPU), a controller, or an application-specific integrated circuit (ASIC), that, when executing recipe instructions stored in the memory 1384 (for one or more of the embodiments in FIGS. 1 to 6, 10 to 16, and 17 to 19), configures the controller 1382 as a special purpose controller that operates apparatus the 1300 to form a graphene according to example embodiments on the substrate 1340.

Although the embodiments have been described above, the present disclosure is not limited thereto, and various modifications may be made by one of ordinary skill in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of forming a graphene structure, the method comprising:
   forming a bonding site inducing a covalent bond with carbon on a surface of a substrate, the forming the bonding site including treating the surface of the substrate using a plasma having power equal to or greater than 600 W; and
   directly growing a graphene on the surface of the substrate via a plasma enhanced chemical vapor deposition (PECVD) process, wherein
   the directly growing the graphene including forming a bonding region, in which a material of the substrate and carbon of the graphene are covalently bonded, between the surface of the substrate and the graphene, and
   the directly growing the graphene is performed using a plasma power of lower than 600 W, wherein
   the directly growing the graphene is performed at a process temperature of less than 600° C. and the forming the bonding site is performed at a process pressure of 0.02 Torr to 5.0 Torr, and
   wherein the bonding region has a SiC content in a range of 40% to 60%.

2. The method of claim 1, wherein
   the directly growing the graphene includes forming the bonding region to cover a part or all of the surface of the substrate.

3. The method of claim 1, wherein
   the substrate includes silicon (Si), and
   the bonding region includes a silicon-carbon (Si—C) bond.

4. The method of claim 1, wherein
   the directly growing the graphene includes growing the graphene to a thickness of 1 nm to 2 nm.

5. The method of claim 1, further comprising
   roughening the surface of the substrate to a certain size before the surface of the substrate is treated.

6. The method of claim 1, wherein
   during the forming the bonding site, the treating the surface of the substrate, includes:
   injecting a certain pre-treatment gas into a process chamber where the substrate is provided; and
   generating the plasma in the process chamber.

7. The method of claim 6, wherein
   the treating the surface of the substrate is performed at a processing temperature lower than or equal to 700° C.

8. The method of claim 6, wherein the directly growing of the graphene includes:
   injecting a reaction gas into the process chamber, the reaction gas including a carbon source; and
   directly growing the graphene on the surface of the substrate by generating an other plasma in the process chamber.

9. A method of forming a graphene structure, the method comprising:

injecting a reaction gas into a process chamber where a substrate is provided, the reaction gas including a carbon source;

forming a bonding site inducing a covalent bond with carbon on a surface of the substrate, the forming the bonding site including generating a plasma having a power equal to or greater than 600 W, the forming the bonding site being performed in the process chamber; and directly growing graphene on the surface of the substrate via a plasma enhanced chemical vapor deposition (PECVD) process, the directly growing the graphene including forming a bonding region, in which a material of the substrate and carbon of the graphene are covalently bonded, between the surface of the substrate and the graphene, wherein the directly growing the graphene is performed using a plasma power of lower than 600 W, wherein the directly growing the graphene is performed at a process temperature of less than 600° C. and the forming the bonding site is performed at a process pressure of 0.02 Torr to 5.0 Torr, and wherein the bonding region has a SiC content in a range of 40% to 60%.

10. The method of claim 9, wherein
the directly growing the graphene includes forming the bonding region to cover a part or all of the surface of the substrate.

11. The method of claim 9, wherein
the substrate includes silicon (Si), and
the bonding region includes a silicon-carbon (Si—C) bond.

12. The method of claim 9, wherein
the directly growing the graphene includes growing the graphene to a thickness of 1 nm to 2 nm.

13. The method of claim 9, further comprising
roughening the surface of the substrate before the injecting the reaction gas.

14. The method of claim 9, further comprising
treating the surface of the substrate using plasma before the injecting the reaction gas.

15. A method of forming a graphene structure, the method comprising:

plasma-treating a surface of a substrate using a power greater than or equal to 600 W, the substrate including a material capable of forming a covalent bond with carbon, the plasma-treating the surface of the substrate providing a plasma-treated surface of the substrate; and directly growing a graphene on the plasma-treated surface of the substrate, a portion of the graphene being covalently bonded to the material of the substrate, wherein the directly growing the graphene is performed using a plasma power of lower than 600 W, the substrate includes silicon (Si), the portion of the graphene that is covalently bonded to the material of the substrate and the substrate form a bonding region in which carbons of the graphene and the material of the substrate are covalently bonded to each other, the bonding region has a SiC content in a range of 40% to 60%, the directly growing the graphene is performed at a process temperature of less than 600° C., and the plasma-treating the surface of the substrate includes forming a bonding site on the surface of the substrate and is performed at a process pressure of 0.02 Torr to 5.0 Torr.

16. The method of claim 15, wherein
the plasma-treating the surface of the substrate includes injecting a pre-treatment gas into a process chamber while the substrate is in the process chamber, the directly growing the graphene includes injecting a reaction gas into the process chamber and performing a plasma enhanced chemical vapor deposition (PECVD) on the substrate while the reaction gas and the substrate are in the process chamber, and the reaction gas includes a carbon source.

17. The method of claim 15,
the plasma-treating the surface of the substrate includes injecting a first reaction gas into a process chamber while the substrate is in the process chamber, the directly growing the graphene includes injecting a second reaction gas into the process chamber and performing a plasma enhanced chemical vapor deposition (PECVD) process on the substrate while the second reaction gas and the substrate are in the process chamber, the first reaction gas includes a first carbon source, and
the second reaction gas includes a second carbon source.

18. The method of claim 15, wherein
the directly growing the graphene includes growing the graphene to a thickness of 1 nm to 2 nm.

* * * * *